United States Patent [19]

Kinoshita

[11] 4,358,686
[45] Nov. 9, 1982

[54] PLASMA REACTION DEVICE

[75] Inventor: Shigeji Kinoshita, Itami, Japan

[73] Assignee: Mitsubishi Denki Kabushiki Kaisha, Japan

[21] Appl. No.: 227,675

[22] Filed: Jan. 23, 1981

[30] Foreign Application Priority Data

Jan. 25, 1980 [JP] Japan .................................. 55/8177

[51] Int. Cl.³ ........................ H01J 37/00; G01K 1/08
[52] U.S. Cl. ................................................. 250/492.2
[58] Field of Search .................. 313/349, 359.1, 360.1;
250/423, 492.2, 398; 219/121 EJ, 121 EL

[56] References Cited

U.S. PATENT DOCUMENTS 4,119,881 10/1978 Calderon .......................... 250/423 R

OTHER PUBLICATIONS

Automatic-continuous wafer-fed plasma etching system (Tokyo Ohka) Hisashi Nakane, Akira Uehara, Hiroyuki Kiyota, Shigekazu Miyazaki, Semiconductor Integrated Circuit Technology, 14th Symposium, The Electrochemical Society 25th May, 1978.

Uniformization of the etching of polysilicon films by the plasma method, Isaburo Miyata, Chieko Ninomiya (Nippon Denshin Denwa Corp., Musashino Lab.) 1978 Electronic Communications Society National Meeting p. 2-32 Preparatory Tex.

Primary Examiner—Bruce C. Anderson
Attorney, Agent, or Firm—Robert E. Burns; Emmanuel J. Lobato; Bruce L. Adams

[57] ABSTRACT

A plasma reaction device having a cylindrical reaction chamber connectable to a gas source for receiving internally thereof a working gas for treating workpieces, such as semiconductor wafers, therein with the working gas. An exterior electrode is mounted exteriorly of and about the working chamber and an interior electrode is disposed in the reaction chamber spaced inwardly from the inner surfaces thereof. A high frequency voltage source is connected across the two electrodes for applying a high frequency voltage to the electrodes to excite the working gas and develop a plasma in a space between the electrodes. The interior electrode has a plurality of plasma-diffusion through-holes arranged and dimensioned to effectively obtain a substantially uniform concentration of the plasma on a surface of the workpiece exposed to the interior of the reaction chamber and therefore exposed to the working gap plasma. The plasma-diffusion through-holes are arranged and dimensioned so that an opening-to-surface ratio of the interior electrode in a portion thereof close to the workpiece surface being treated is relatively small. The interior electrode is constructed so that this ratio is relatively large on a portion of the interior electrode more remote from the surface of the workpiece being treated. The ratio is computed by dividing the total cross section area of the through-holes by the remainder of the total surface area of the interior electrode less the total cross section area of the through-holes in terms of a unit area of the interior electrode.

6 Claims, 7 Drawing Figures

PLASMA REACTION DEVICE

BACKGROUND OF THE INVENTION

1. Field of the Invention

This invention relates generally to plasma reaction devices, and more particularly to such devices used for plasma etching, plasma deposition, and plasma refining, etc. and make use of cylindrical, concentric electrodes.

2. Description of the Prior Art

Plasma reaction techniques are widely used in the manufacture of semiconductor devices. These techniques are used, for example, in etching, deposition and refining semiconductor wafers. Plasma reaction devices of the type using a cylindrical reaction chamber about which an exterior electrode is disposed and a cylindrical interior electrode with plasma-diffusion through-holes are known. These devices have the plasma-diffusion through-holes distributed uniformly throughout the interior electrode and are of a uniform cross section and each of a same cross section area dimension.

These devices have the reaction chamber connected to a vacuum pump and a working gas is let into the reaction chamber through a base having inlet openings. A stage is mounted in the interior of the reaction chamber for holding a workpiece interiorly of the interior electrode for treatment of an exposed surface of the workpiece with a plasma of the working gas. The plasma is developed by exciting the working gas with a high frequency voltage applied across the electrodes from a high frequency voltage source.

These known plasma reaction devices, however, do not develop a uniform plasma concentration over the surface of a workpiece being treated. This arises from the lack of accurate control of uniformity of the plasma, in the reaction chamber, by the plasma-diffusion mechanism of the through-holes or openings in the interior electrode.

As a consequence of the lack of uniformity of plasma diffusion there is lack of uniformity of reaction rates for example, lack of uniformity of treatment on the surface such as lack of uniform etching rates thereof.

SUMMARY OF THE INVENTION

An object of the present invention is to provide a plasma reaction device which does not alter in reaction rate or uniformity of treatment of a workpiece surface and which is capable of carrying out precision pattern forming on the workpiece surface over a wide range of reaction gas pressures in the device.

In order to achieve this object, an interior electrode of a plasma reaction device of the present invention has a varying permeability to plasma or a varying opening-to-surface ratio (calculated by dividing total cross section area of the holes by the remainder of the surface area of the electrode less the area of the holes in terms of a unit area of the interior electrode) in accordance with the distance from the workpiece.

In accordance with this invention, in a plasma reaction device in which hollow cylindrical electrodes are provided concentrically in the interior and exterior of a cylindrical reaction chamber, and on the inside of the interior electrode a workpiece stage is provided, plasma-diffusion through-holes are formed in the interior electrode to increase the permeability to plasma or the opening-to-surface ratio of the electrode in accordance with the increasing distance from the workpiece.

BRIEF DESCRIPTION OF THE DRAWINGS

The present invention will become more readily apparent from the following description of the preferred embodiments of the invention taken in conjunction with the accompanying drawings, in which.

DESCRIPTION OF THE PREFERRED EMBODIMENTS

Figure 1:
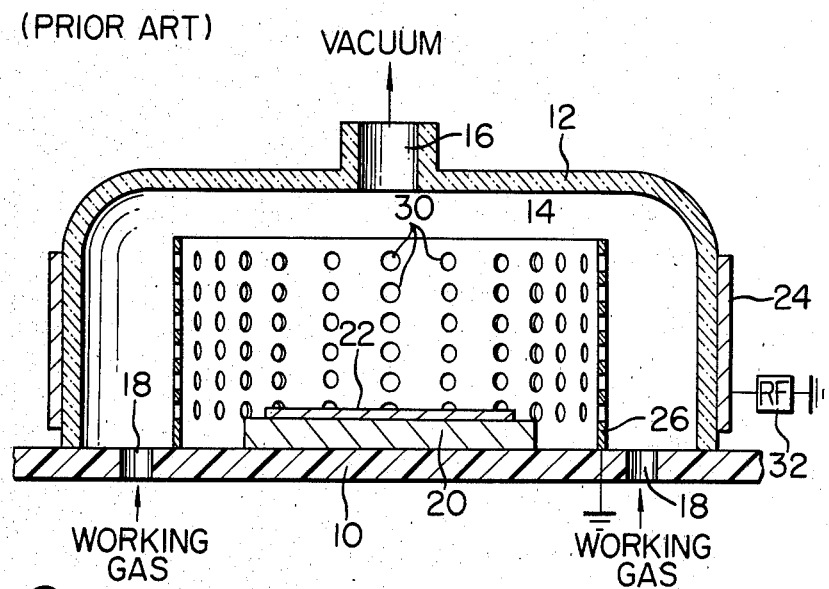
FIG. 1 is a sectional view showing a prior art plasma reaction device.

The conventional plasma reaction device for use in etching semiconductor wafers typically has a construction as shown in FIG. 1. It is seen that the device comprises a base 10 made of a suitable insulating material and a bell-shaped enclosure 12 removably placed on the base 10 in a hermetic relationship. The enclosure 12 is made of quartz and defines therein a substantially cylindrical reaction chamber 14 closed by the base 10. The reaction chamber 14 is connectable to an unillustrated vacuum pump through an exhaust vent 16 provided in the top central portion of the quartz enclosure 12. The reaction chamber 14 is also connectable to a source, not shown, of a working gas such as $CF_4$ gas through inlet ports 18 formed in the base 10. The base 10 supports on its inner surface a workpiece stage 20 on which a workpiece 22, such as a semiconductor wafer to be etched, is supported.

The plasma reaction device also comprises a pair of concentrically disposed hollow cylindrical electrodes 24 and 26 positioned at the exterior and interior of the reaction chamber 14, respectively. The external electrode 24 is supported by the outer surface of the enclosure 12 so that the electrode 24 is disposed exteriorly and circumferentially of the cylindrical reaction chamber 14 and concentric therewith. The internal electrode 26 is supported on the insulated base 10 within the reaction chamber 14 and spaced inwardly from the inner surfaces and concentric with the external electrode 24. The internal electrode 26 has formed therein a plurality of through-holes 30 for the purpose which will be made apparent from the following description.

It is to be noted that the through-holes 30 are substantially evenly distributed throughout the entire surface area of the internal electrode 26 and that they all are cross sectionally of equal size (typically 5 mm in diameter). In other words, an opening-to-surface ratio of the internal electrode 30 (a ratio of the total cross section area of the holes to the surface area of the internal electrode less the area of the holes in terms of a unit area of the electrode) is uniform over the electrode surface.

In an etching operation, while the etching chamber 14 is being exhausted through the exhaust vent 16 by means of a vacuum pump, not shown, etching gas such as $CF_4$ gas is introduced into the annular space within the etching chamber 14 through inlet holes 18, and the interior of the etching chamber 14 is maintained at a relatively low pressure. High frequency electrical energy is applied across the electrodes 24 and 26 from a high frequency power source 32. High frequency discharging between the interior electrode 26 and the exterior electrode 24 is caused, thus exciting the working gas and producing a plasma in the annular space within the reaction chamber 14, and the workpiece 22 on the workpiece stage 20 is etched by active radicals in the plasma which have been diffused through the through-holes 30 and reached the workpiece 22.

This etching reactant is generally believed to be chiefly the neutral active component (radicals) in the plasma as stated above. It is thought that this etching reactant is produced between the electrodes 24 and 26 and reaches the workpiece 22, which is outside the region of production, by means of a gas diffusion mechanism effected through the through-holes 30 in the interior electrode 26, and reacts with the workpiece. The active life of the radicals is limited, and it varies with the etching gas pressure.

Figure 2:
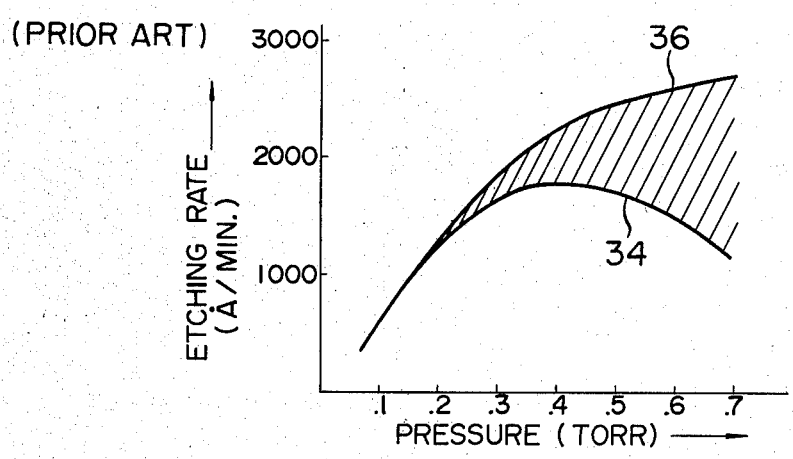
FIG. 2 is a graph of the characteristics of the etching of a polycrystalline silicon, to explain the operation of the device in FIG. 1.
Figure 3:
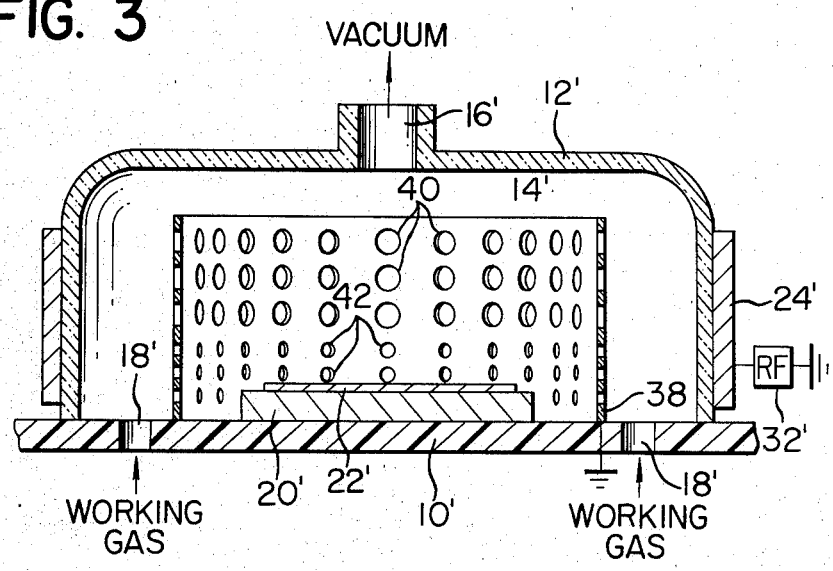
FIG. 3 is a sectional view showing one embodiment of a plasma etching device according to the present invention.

However, in this known plasma etching device, to give one example, the relationship between the etching rate and the etching gas pressure in etching a polycrystalline silicon layer on the wafer with $CF_4$ gas was sought by experiment. It was found that in order to increase the etching rate the etching gas pressure must be raised, but when the etching gas pressure is raised the uniformity of the etching rate in the wafer deteriorates, as shown in FIG. 2, with the rate at the center portion of the wafer shown by a curve 34 and the rate at the peripheral portion shown by a curve 36 diverging considerably. When the etching gas pressure is high, the average free excursion of the radicals is short, so the radical density at the peripheral portion of the wafer becomes quite high and the etching rate, too, rises. Consequently, uniformity in the etched depth of the wafer deteriorates. In order to preserve uniformity, i.e. to overcome this defect, it is necessary to accurately control the etching gas pressure.

The present invention will now be described in detail in terms of the embodiments of the invention shown in FIGS. 3 to 7. A plasma reaction device of the present invention comprises an interior electrode 38 within a reaction chamber 14' defined by an enclosure 12' and a base 10'. It is seen that the interior electrode 38 of the plasma reaction device of the present invention is different in the arrangement of the plasma-diffusion through-holes formed therein from the conventional interior electrode 26 shown in FIG. 1, and that the other parts of the reaction device are identical to those shown in FIG. 1 but the corresponding reference numerals are primed.

The interior electrode 38 of the plasma reaction device of the present invention has formed therein a plurality of plasma-diffusion through-holes 40 and 42 for allowing the plasma generated in the annular space between the electrodes 24' and 38 and within the reaction chamber 14' to be introduced therethrough into the central region in which the workpiece 22' is placed. It is to be noted that the holes 40 provided in the upper portion of the electrode 28', or the electrode portion relatively distant from the workpiece 22' supported on the workpiece stage 20', are relatively large and may have a diameter of 5 mm, and that the holes 42 provided in the lower portion of the electrode 38, or the portion relatively close to the workpiece 22', are relatively small and may have a diameter of 1 mm. The pitch of the through-holes 40 and 42 is uniform throughout the electrode 38.

Therefore, the interior electrode 38 of the plasma reaction device of the present invention has a relatively large permeability to plasma or a relatively large opening-to-surface ratio at a position of the internal electrode relatively distant from the workpiece 22' on the workpiece stage 20', and a relatively small permeability to plasma or a relatively small opening-to-surface ratio at a position on the electrode relatively close to the workpiece 22'. The dimensional relationship between the larger and smaller through-holes 40 and 42 should be selected so that plasma concentration on the entire surface of the workpiece on the workpiece stage is substantially uniform.

It is believed that the reason that the plasma concentration uniformity on the workpiece can be maintained by the controlled opening-to-surface ratio of the interior electrode 38 is that, while the plasma generated in the annular plasma generating space has a substantially uniform density in this space, the radical density immediately inside of the interior electrode 38 is controlled by the varying opening-to-surface ratio of the electrode 38 and becomes relatively low at the lower portion and relatively high at the upper portion, and that the low density radicals from the lower portion of the electrode 38 reach the workpiece without being greatly rarefied because of the shorter travel path and travel time while the high density radicals from the upper portion of the electrode 38 reach the workpiece 22' only after being relatively greatly rarefied because of the longer travel path and travel time.

Figure 4:
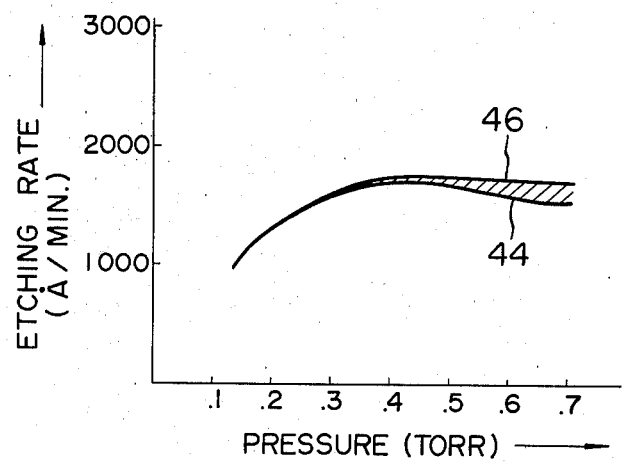
FIG. 4 is a graph of the etching characteristics of a polysilicon to illustrate the operation of the device in FIG. 3.

FIG. 4 shows the results of an experiment in which the plasma etching device according to the present invention was used in etching a polycrystalline silicon layer. From FIG. 4, it is seen that the difference between the etching rate at the central portion of the wafer shown by a curve 44 and the etching rate at the peripheral portion of the wafer shown by a curve 46 is greatly decreased as compared to the etching rate difference according to the prior art device shown in FIG. 2. It is also seen that both the etching rates shown by the curves 44 and 46 are constant over a significantly wide pressure range.

Figure 5:
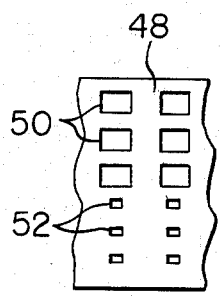
FIGS. 5 to 7 are fragmental views of the modified interior electrodes of the present invention.
Figure 6:
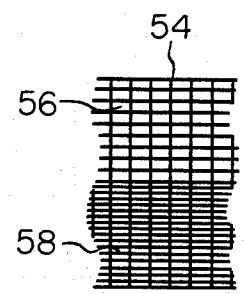
Figure 7:
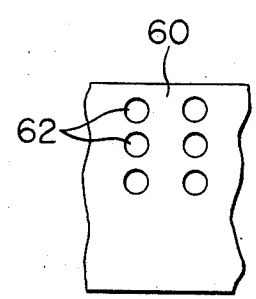

FIGS. 5 to 7 illustrate other embodiments of the interior electrode constructed according to the present invention. In FIG. 5, an interior electrode 48 has provided therein a plurality of rectangular plasma-diffusion through-holes 50 and 52, the upper holes 50 are larger in cross section size and the lower holes 52 are smaller in cross section size. FIG. 6 shows another interior electrode 54 which is formed of a metal net. It has rectangular apertures 56 in the upper portion of the net 54 which are larger than rectangular apertures 58 in the lower portion. FIG. 7 shows still another interior electrode 60 which has circular plasma-diffusion through-holes 62 in the upper portion of the electrode 60 while no holes are provided in the lower portion of the electrode 60. In this embodiment the opening-to-surface ratio of the lower portion, or the electrode portion relatively close to the workpiece can be deemed to be zero.

What is claimed is:

1. A plasma reaction device for treating semiconductor workpieces comprising; means defining a cylindrical rection chamber connectable to a working gas supply source of a gas for treating semiconductor workpieces therein; a cylindrical exterior electrode disposed circumferentially of said reaction chamber externally thereof; a cylindrical interior electrode disposed interiorly of said reaction chamber spaced inwardly from inner surfaces thereof; a workpiece stage disposed within said interior electrode for supporting a workpiece for treatment interiorly of said interior electrode; a high frequency power source connected across said electrodes for applying thereto a high frequency voltage effective to excite the working gas in said reaction chamber to develop a plasma between the electrodes; said interior electrode having a plurality of plasma-diffusion through-holes distributed and dimensioned to effectively obtain a substantially uniform plasma concentration on a surface of said workpiece being treated and exposed to the interior of said reaction chamber; the plasma-diffusion through-holes being arranged and dimensioned so that an opening-to-surface ratio of said interior electrode at a portion close to said workpiece is relatively small and is relatively large on a portion of the interior electrode more remote from said surface of the workpiece, whereby the concentration of plasma on said surface of the workpiece is substantially uniform throughout the surface of the workpiece; and said ratio being obtained by dividing the total cross section area of the through-holes by the remainder of the total surface area of the interior electrode less the total area of the through-holes in terms of a unit area of the interior electrode.

2. A plasma reaction device according to claim 1, in which the opening-to-surface ratio of said interior electrode at the portion close to said surface of the workpiece is zero.

3. A plasma reaction device according to claim 1 or 2, in which said plasma-diffusion through-holes have a rectangular cross section.

4. A plasma reaction device according to claim 1 or 2, in which said plasma-diffusion through-holes have a circular cross section.

5. A plasma reaction device according to claim 1 or 2, in which said interior electrode comprises a net structure.

6. A plasma reaction device as claimed in claim 1 or 2, in which said workpiece to be treated is a workpiece to be etched, and in which said working gas is a gas for etching said workpiece.

* * * * *